(12) United States Patent
Atkinson

(10) Patent No.: US 9,465,066 B2
(45) Date of Patent: Oct. 11, 2016

(54) TRANSFORMER EVALUATION

(71) Applicant: ALCATEL-LUCENT USA INC., Murray Hill, NJ (US)

(72) Inventor: Gary W. Atkinson, Freehold, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 132 days.

(21) Appl. No.: 14/182,761

(22) Filed: Feb. 18, 2014

(65) Prior Publication Data
US 2015/0233997 A1 Aug. 20, 2015

(51) Int. Cl.
| | |
|---|---|
| *G01R 31/02* | (2006.01) |
| *G01R 35/02* | (2006.01) |
| *G08C 17/00* | (2006.01) |
| *G01W 1/10* | (2006.01) |
| *H02J 3/00* | (2006.01) |

(52) U.S. Cl.
CPC .............. *G01R 31/027* (2013.01); *G01R 35/02* (2013.01); *G08C 17/00* (2013.01); *G01W 1/10* (2013.01); *H02J 3/00* (2013.01)

(58) Field of Classification Search
CPC ........ G01W 1/10; H02J 3/00; G01R 31/027; G01R 35/02; G08C 17/00
USPC .............................................. 702/3; 324/547
See application file for complete search history.

(56) References Cited

U.S. PATENT DOCUMENTS

| | | | |
|---|---|---|---|
| 4,654,806 A | 3/1987 | Poyser et al. | |
| 6,424,266 B1 | 7/2002 | Weekes et al. | |
| 2002/0180611 A1* | 12/2002 | Weekes et al. | 340/646 |
| 2014/0052503 A1* | 2/2014 | Zaloom | 705/7.39 |

FOREIGN PATENT DOCUMENTS

| | | | | |
|---|---|---|---|---|
| WO | 2006135995 | A2 | 12/2006 | |
| WO | WO 2006135995 | A1 * | 12/2006 | ............... H02J 3/00 |

OTHER PUBLICATIONS

International Search Report and Written Opinion of the International Searching Authority for International application No. PCT/US2015/014176 dated May 11, 2015.
Alcatel-Lucent, "EPB and Alcatel-Lucent Bell Labs putting the smarts into Chattanooga's Smart Grid," Press Release May 2011, http://www.tmcnet.com/usubmit/2011/05/31/5544240.htm.
O.S. Popescu, N.E. Mastorakis, and L.N. Popescu-Perescu, "Modelling of Oil-filled Transformer," International Journal of Mathematical Models and Methods in Applied Sciences, vol. 3, No. 4, 2009, pp. 346-355.
IEEE Std C57.91/2011, IEEE Guide for Loading Mineral-Oil-Immersed Transformers and Step-Voltage Regulators, 106 pages.
US Department of the Interior Bureau of Reclamation, "Permissible Loading of Oil-Immersed Transformers and Regulators," Facilities Engineering Branch, Denver Office, Denver, Colorado, Internet Version 2000.
IEC International Standard IEC 60076-7-2005, "Power transformers—Part 7: Loading guide for oil-immersed power transformers," 2005 (122 pages).
A. van Schijndel, J. Wetzer and P. Wouters, "Forecasting Transformer Reliability," 2006 Annual Report Conference on Electrical Insulatoin and Dielectric Phenomena, 2006, p. 577-582.

* cited by examiner

*Primary Examiner* — Melissa Koval
*Assistant Examiner* — Rahul Maini
(74) *Attorney, Agent, or Firm* — Carlson, Gaskey & Olds, P.C.

(57) ABSTRACT

An illustrative method of evaluating a condition of a plurality of transformers that are located remotely from each other, includes: obtaining an ambient temperature for respective sites of the transformers at a plurality of times during a period; determining respective loading at the transformers at the plurality of times; and determining respective aging rates of the transformers during the period based on the respective ambient temperatures and loadings.

14 Claims, 4 Drawing Sheets

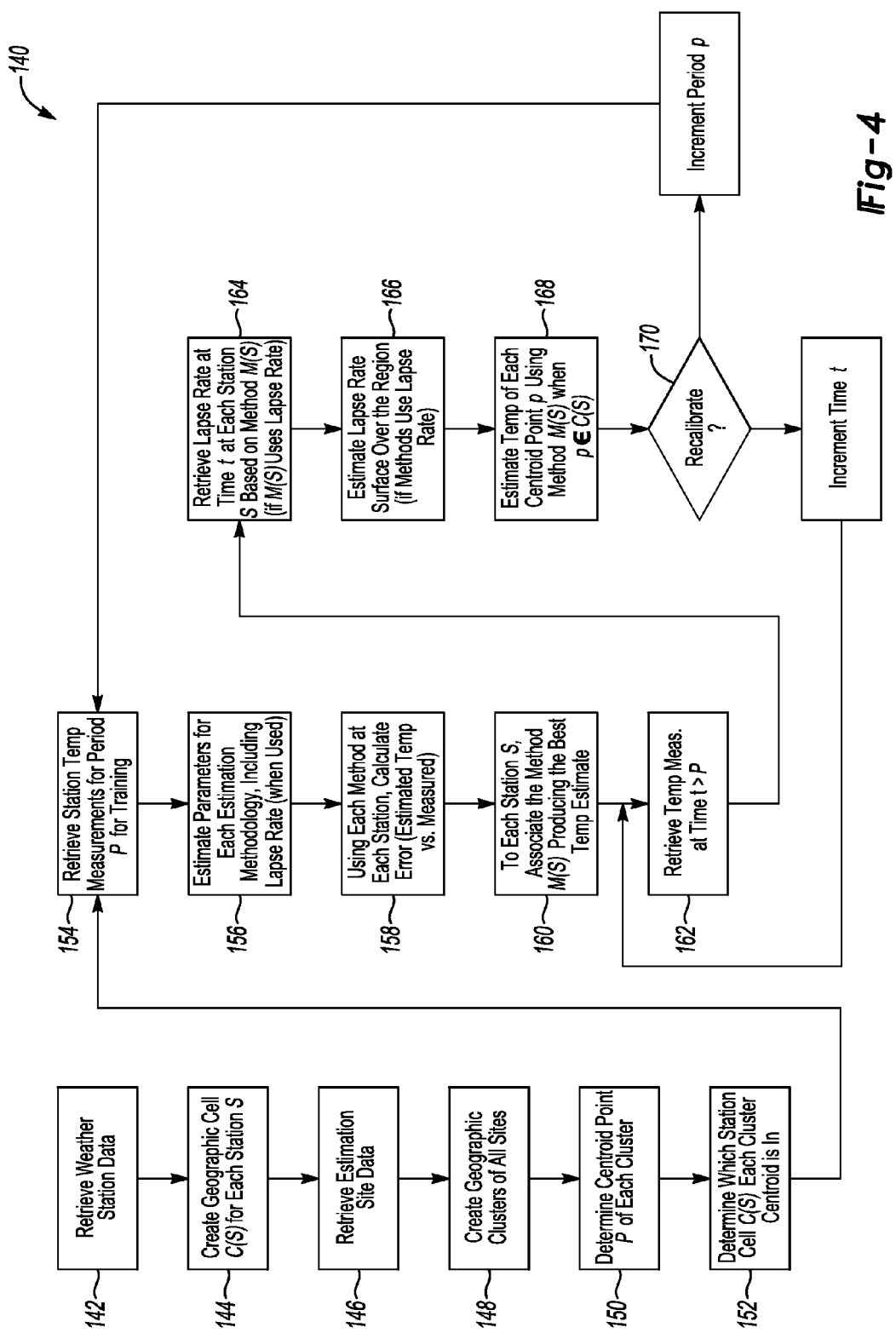

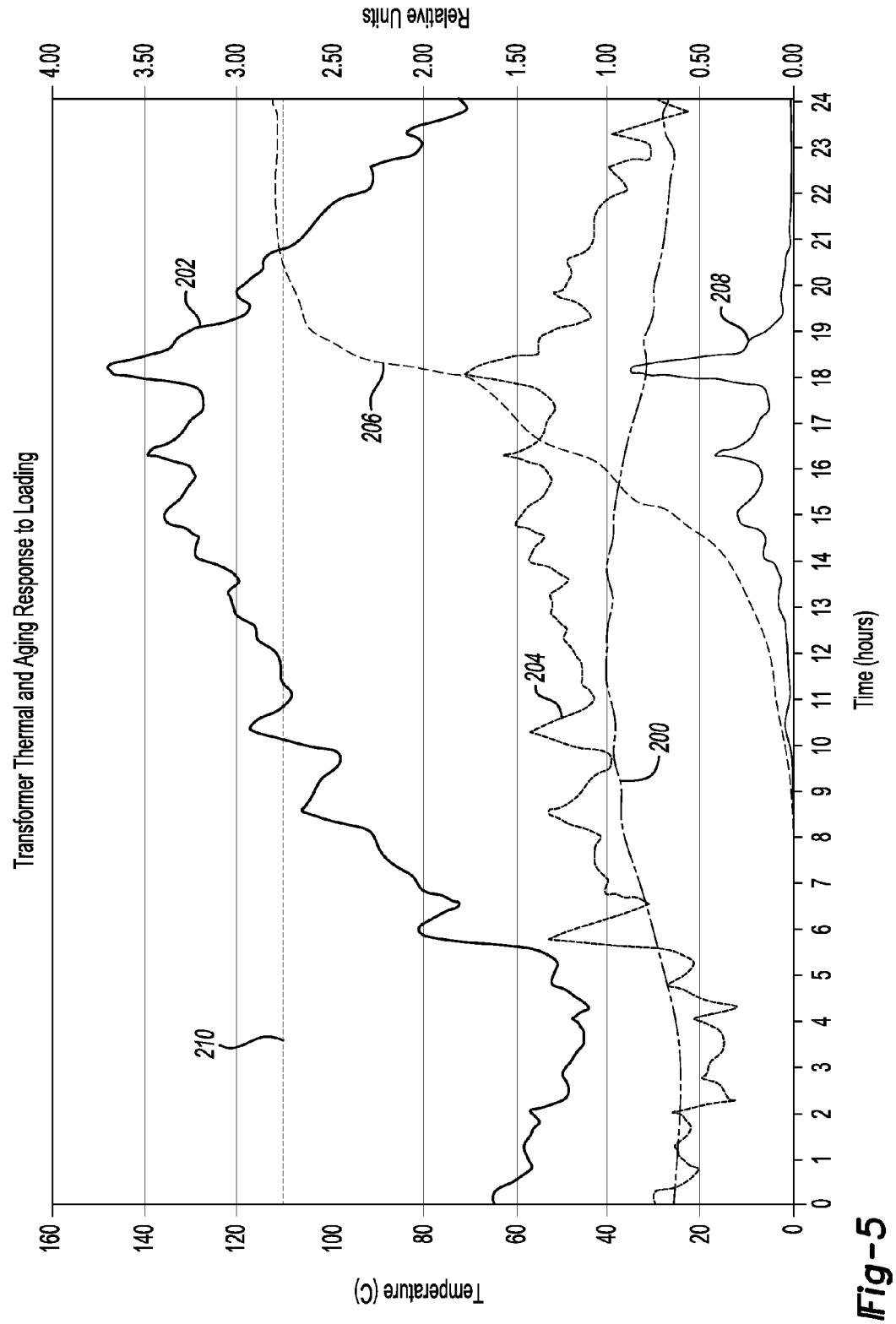

TRANSFORMER EVALUATION

TECHNICAL FIELD

The subject matter of this document generally relates to transformer evaluation. More particularly, and without limitation, the subject matter of this document relates to estimating transformer aging based on discrete temperature and load information.

DESCRIPTION OF THE RELATED ART

Effectively managing utility company infrastructure and assets is necessary to improving utility performance and cost-effectiveness. The infrastructure needed to supply electrical power in a typical metropolitan area includes many distribution transformers. Unfortunately, transformers are subject to failure, which interrupt power supply to customers and introduces additional costs to the utility company.

It is difficult for utility companies to accurately predict when a transformer is approaching the end of its useful life. Typical transformers have a rated life expectancy at a rated load. The actual loading experienced by transformers, however, varies significantly over time. Additionally, the temperature conditions at the transformer impact the useful life span of the transformer. It can be impractical and too costly to expect to directly measure temperature and loading at every transformer that a utility company deploys. Without an accurate estimate of remaining transformer lifetime, utility companies usually are unable to avoid some transformer failures, replace some transformers too early, and are required to maintain an inventory of transformers that usually exceeds their needs. Each of these factors contributes to costs to the utility company that might otherwise be avoided.

SUMMARY

An illustrative example method of evaluating a condition of a plurality of transformers that are located remotely from each other, includes: obtaining an ambient temperature for respective sites of the transformers at a plurality of times during a period; determining respective loading at the transformers at the plurality of times; and determining respective aging rates of the transformers during the period based on the respective ambient temperatures and loadings.

In an example method having one or more features of the method of the previous paragraph, determining the respective aging rates comprises determining respective hottest spot temperatures of the transformers at the plurality of times.

An example method having one or more features of the method of any of the previous paragraphs includes performing the method for a plurality of periods; and determining respective cumulative aging of the transformers over a time including the periods.

In an example method having one or more features of the method of any of the previous paragraphs, the plurality of times are spaced at intervals of an hour or less.

In an example method having one or more features of the method of any of the previous paragraphs, the plurality of times are spaced at intervals of approximately five minutes.

In an example method having one or more features of the method of any of the previous paragraphs, the transformers are associated with respective meters; the meters provide respective indications of loading based on power consumption at respective customer locations; the loading at each transformer comprises a total loading at each of the plurality of times; and the total loading is based on the indications of loading of the associated respective meters.

An example method having one or more features of the method of any of the previous paragraphs includes determining the ambient temperatures based on an estimated ambient temperature for the respective sites of the transformers.

An example method having one or more features of the method of any of the previous paragraphs includes estimating the ambient temperature by: clustering the sites into a plurality of clusters; determining a centroid for each cluster; associating each centroid with a measurement station; and estimating the ambient temperature at each of the sites based on a temperature at the measurement station associated with the centroid of the cluster including the transformer site.

In an example method having one or more features of the method of any of the previous paragraphs, there are more transformers than measurement stations.

An illustrative example transformer evaluation device includes data storage and a processor that is configured to: obtain an ambient temperature for respective sites of the transformers at a plurality of times during a period; determine respective loading at the transformers at the plurality of times; and determine respective aging rates of the transformers during the period based on the respective ambient temperatures and loadings.

In an example transformer evaluation device having one or more features of the transformer evaluation device of any of the previous paragraphs, the processor is configured to determine the respective aging rates including determining respective hottest spot temperatures of the transformers at the plurality of times.

In an example transformer evaluation device having one or more features of the transformer evaluation device of any of the previous paragraphs, the processor is configured to determining respective cumulative aging of the transformers over a time including a plurality of periods.

In an example transformer evaluation device having one or more features of the transformer evaluation device of any of the previous paragraphs, the plurality of times are spaced at intervals of an hour or less.

In an example transformer evaluation device having one or more features of the transformer evaluation device of any of the previous paragraphs, the plurality of times are spaced at intervals of approximately five minutes.

In an example transformer evaluation device having one or more features of the transformer evaluation device of any of the previous paragraphs, the transformers are associated with respective meters; the meters provide respective indications of loading based on power consumption at respective customer locations; the loading at each transformer comprises a total loading at each of the plurality of times; and the total loading is based on the indications of loading of the associated respective meters.

In an example transformer evaluation device having one or more features of the transformer evaluation device of any of the previous paragraphs, the processor is configured to determine the ambient temperature based on an estimated ambient temperature for the respective sites of the transformers.

In an example transformer evaluation device having one or more features of the transformer evaluation device of any of the previous paragraphs, the processor is configured to estimate the ambient temperatures by: clustering the sites into a plurality of clusters; determining a centroid for each cluster; associating each centroid with a measurement station; and estimating the ambient temperature at each of the sites based on a temperature at the measurement station associated with the centroid of the cluster including the transformer site.

In an example transformer evaluation device having one or more features of the transformer evaluation device of any of the previous paragraphs, there are more transformers than measurement stations.

An illustrative example non-transitory storage medium comprises computer-executable instructions to: obtain an ambient temperature for respective sites of a plurality of transformers at a plurality of times during a period; determine respective loading at the transformers at the plurality of times; and determine respective aging rates of the transformers during the period based on the respective ambient temperatures and loadings.

In an example storage medium having one or more features of the storage medium of the previous paragraph, the computer-executable instructions comprise instructions to determine the respective aging rates including determining respective hottest spot temperatures of the transformers at the plurality of times.

Various embodiments and their features will become apparent to those skilled in the art from the following detailed description of at least one example embodiment. The drawings that accompany the detailed description can be briefly described as follows.

BRIEF DESCRIPTION OF THE DRAWINGS

FIG. 4 is a flowchart diagram summarizing an example temperature estimation approach.

FIG. 5 graphically illustrates transformer evaluation information obtained using an example embodiment.

DETAILED DESCRIPTION

Figure 1:
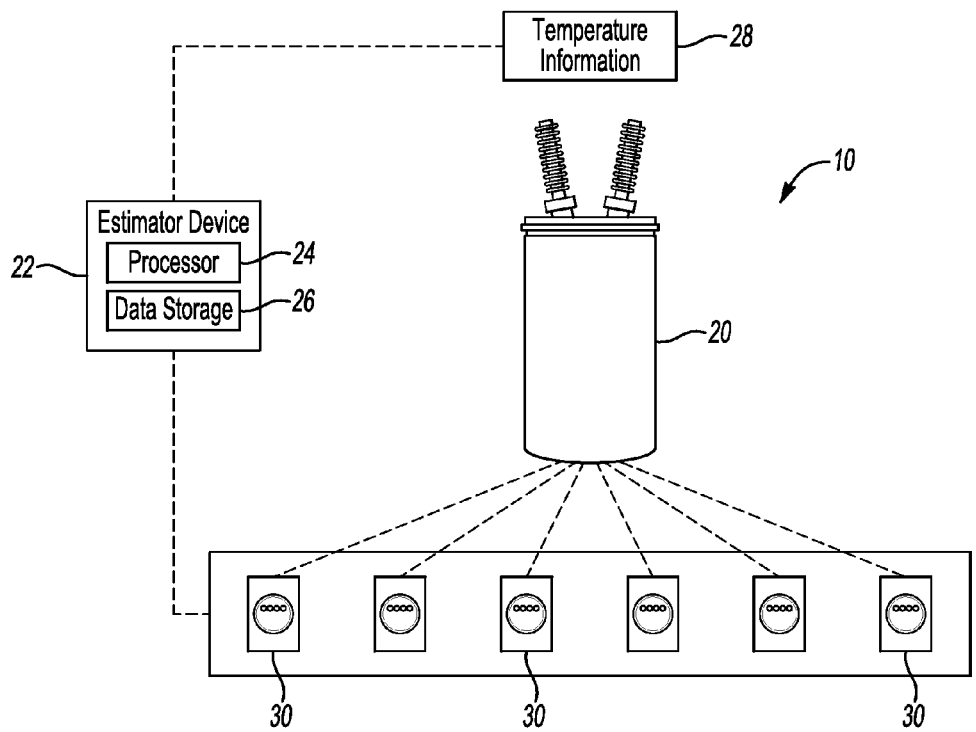
FIG. 1 schematically illustrates selected features of an example system for evaluating a condition of a transformer.

FIG. 1 schematically illustrates a system 10 that is useful for evaluating one or more conditions of a transformer 20. An estimator device 22 includes a processor 24 that is configured to execute at least one evaluation algorithm and a data storage 26 that contains information used by the processor for the evaluation. The schematic illustration represents the processor 24 as a single unit and the data storage 26 as a single unit for discussion purposes only. An embodiment of the estimator device 22 may be realized through a plurality of computing resources, such as computers and servers. The form of the estimator device 22 may vary and the resources may be in a single location or be distributed, such as through a cloud computing system, among various locations.

The data storage 26 may include programming for the processor 24, such as computer-executable instructions that the processor 24 executes for providing temperature estimates. Alternatively, the processor 24 may include its own memory portion that contains such programming or instructions.

The estimator device 22 in this example obtains information schematically shown at 28 regarding ambient temperatures at the location of the transformer 20. The ambient temperature information may be used by the processor 24 in real time or may be stored in the data storage 26 for later use by the processor 24.

The example transformer 20 is situated to provide electrical power to a plurality of customers, which are represented by meters 30. In at least one embodiment, the meters 30 are smart meters that are capable of reporting information regarding energy consumption at particular times or during particular time intervals. The information from the meters 30 provides the estimator device 22 with indications of the load experienced by the transformer 20.

Based on the ambient temperature information and information regarding the corresponding load experienced by the transformer 20, the estimator device 22 provides information for evaluating at least one characteristic of the transformer 20. In the following discussion transformer aging is discussed as an example characteristic that can be estimated based on ambient temperature and load information from discrete times within a selected period. Some embodiments include discrete times that are spaced at intervals of no more than an hour. Other embodiments include times spaced at intervals of thirty minutes, fifteen minutes, or five minutes.

Figure 2:
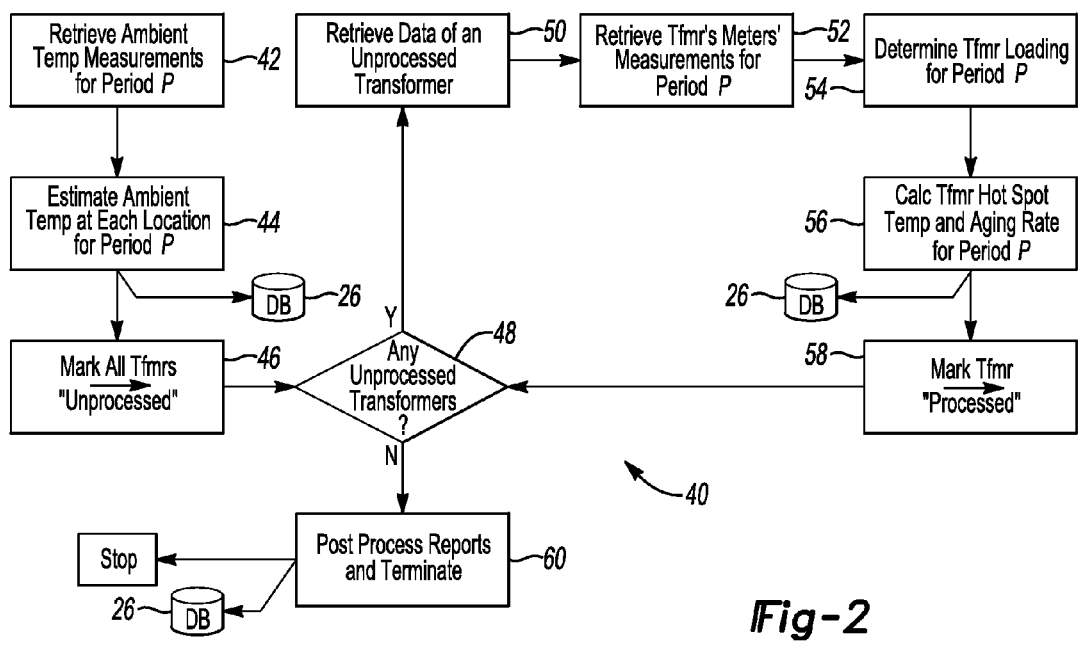
FIG. 2 is a flowchart diagram summarizing an example transformer evaluation technique.

FIG. 2 is a flowchart diagram 40 that summarizes an approach for estimating transformer aging of a plurality of transformers based on temperature and load information. At 42, ambient temperature measurements are obtained from existing weather stations. The weather station temperature measurements provide information that can be used to estimate the ambient temperature at the site(s) of any transformer(s) of interest. There will be many more transformers than weather stations and it is impractical to obtain an actual temperature measurement at each transformer site. Instead, at 44, the ambient temperature at each transformer site is estimated and that information is placed in the data storage 26.

The transformers of interest are identified at 46 and each is indicated as needing evaluation. In the example of FIG. 2, the transformers of interest are at least initially marked "unprocessed." At 48, the processor 24 determines whether all transformers of interest have been processed. While there are still transformers that require evaluation, the example process continues at 50 where the processor 24 retrieves information regarding one of the transformers of interest. That information may include an identification of the associated meters 30, the geographic location of the transformer, ambient temperature estimates for the transformer site, a local power factor, an aging rate scaling parameter, an operational temperature target for the transformer, a transformer oil response time constant (for transformers that include oil for controlling coil temperature), a winding response time constant, a rated load of the transformer, a rated-load-loss-to-no-load-loss ratio for the transformer, and a cooling-type exponent. Different or additional information regarding the transformer(s) may be useful in some embodiments and those skilled in the art who have the benefit of this disclosure will be able to determine what information is useful for their implementation.

At 52, the processor 24 obtains information from the meters 30 associated with the transformer currently under evaluation for the relevant time period. Some embodiments include additional information, such as substation and connectivity information.

At 54, the processor 24 determines the loading experienced by the subject transformer. Changes in the loading over time may be discerned from information from the meters 30 associated with the transformer. Each meter 30 provides an indication of the energy consumption over a relatively small time interval. The energy consumption information may be considered an average power consumption during that time interval. The average consumption information provides an indication of the load at the corresponding customer location and all of the meter loading information together provides an indication of total transformer loading at a plurality of discrete times during a selected time interval.

At 56, the processor 24 determines a transformer hot spot temperature and an aging rate for the time period corresponding to the estimated ambient temperatures and the meter samplings. There are some known computation methodologies regarding transformer hot spot and aging. One embodiment takes advantage of such methodologies from standards-based models that have validated behavior, that are computationally light, and that are applicable to a variety of transformer configurations for making the estimation regarding transformer aging based on ambient temperature and loading information over a selected period of time.

One aspect of transformer aging is related to insulation degradation as winding insulation failure is known to be a common failure mode in oil-immersed transformers, for example. One embodiment includes using a transformer aging estimation technique that is based on insulation aging and includes the following formula for a transformer aging rate A(t)

$$A(t) = \text{aging rate} = A_0 \exp[-\alpha/(\theta_h(t)+273)]$$

wherein
$A_0$ is $\exp[\alpha/(T_0+273)]$;
$\alpha$ is an aging rate scaling parameter (in ° K);
$T_0$ is the operational temperature target (in ° C.); and
$\theta_h(t)$ is the transformer hot spot temperature at time t (in ° C.).

The loss of transformer lifetime (L) based on insulation aging can then $$L = \text{loss of lifetime} = \int_{t}^{t'} A(s)ds$$

be described by the following equation
and the residual lifetime of the transformer at time t' is $\Lambda(t') = \Lambda(t) - L$, where $\Lambda(t)$ is the estimated residual lifetime of the transformer at time t.

Determining the aging A(t) above depends on determining the transformer's hottest spot temperature $\theta_h(t)$. One approach includes relating the hottest spot temperature to the temperature at or near the top of the transformer windings at the top of the oil tank. The following expresses such a relationship $$\theta_h(t) = \theta_{top}(t) + \Delta\theta_{h,w}(t) - \Delta\theta_{h,o}(t)$$

wherein $\Delta\theta_{h,w}(t)$ and $\Delta\theta_{h,o}(t)$ are the winding hottest spot-to-top oil temperature gradient over the top-oil temperature due to the winding response and oil viscosity, respectively. The top-oil temperature is based on the known ANSI/IEEE Clause 7 top-oil rise model corrected for ambient temperature variation, which can be expressed in differential form as $$\tau_o d\theta_{top}/dt = -\theta_{top}(t) + \theta_{amb}(t) + \theta_{fl}[(I(t)^2 R+1)/(R+1)]^n$$

wherein
$\theta_{top}$ is the top-oil temperature (in ° C.);
$\theta_{amb}$ is the ambient temperature (in ° C.);
$\theta_{fl}$ is the top-oil rise over ambient temperature at rated load (in ° K);
$\tau$ is the oil time constant (in minutes);
I is the ratio of load to rated load;
R is the ratio of load loss to no-load loss at rated load;

n is the oil exponent selected for each cooling mode (e.g., ONAN, ONAF, ODAF/WF, OFAF/WF) to approximate change in resistance with load.

The hottest spot-to-top oil temperature gradients are each governed by an equation of the form $$\tau_x d\Delta\theta_{h,x}/dt = a_x[b_x \Delta\theta_{h,r} I(t)^{2m} - \Delta\theta_{h,x}(t)]$$

wherein
x in a subscript is w for a winding response or o for oil viscosity response;
$\Delta\theta_{h,x}$ is the hottest spot to top oil temperature gradient over the top-oil temperature due to "x" (in ° C.);
$\Delta\theta_{h,r}$ is the hottest-spot-to-top-oil gradient at rated current (in ° C.);
$\tau_x$ is the time constant for "x" (in minutes);
$a_x$, $b_x$ are thermal constants for "x"; and
m is the load exponent for current versus winding temperature rise in steady state.

From the several equations above, the ambient temperature estimates, and the loading information, the processor 24 determines the hottest spot temperature $\theta_h(t)$. That hottest spot temperature is then used in the aging model. In the illustrated example, the temperature and loading information are provided to the processor 24 as inputs in discrete time intervals. The equations are solved using discrete time solution methods. For example, the Runge-Kutta family of algorithms may be used.

Once the transformer has been evaluated, which is complete when the aging information is determined, that transformer is marked as "processed" at 58 and the processor 24 repeats the procedure from the steps shown at 50-56 regarding any other transformers for which evaluation is desired. In the illustrated example, the processor 24 generates a report at 60 regarding the results of the transformer evaluations and this information is stored in the data storage 26.

The manner in which temperature estimates are obtained at 44 may include a technique of using actual temperature measurements from existing weather measurement stations 130 and may also include spatial interpolation to estimate the ambient temperature at each transformer site of interest. Such spatial interpolation approach avoids a need to obtain an actual ambient temperature reading at each transformer site, which provides significant savings in costs for situations where transformers to be evaluated do not have any capability to provide ambient temperature measurement information.

Figure 3:
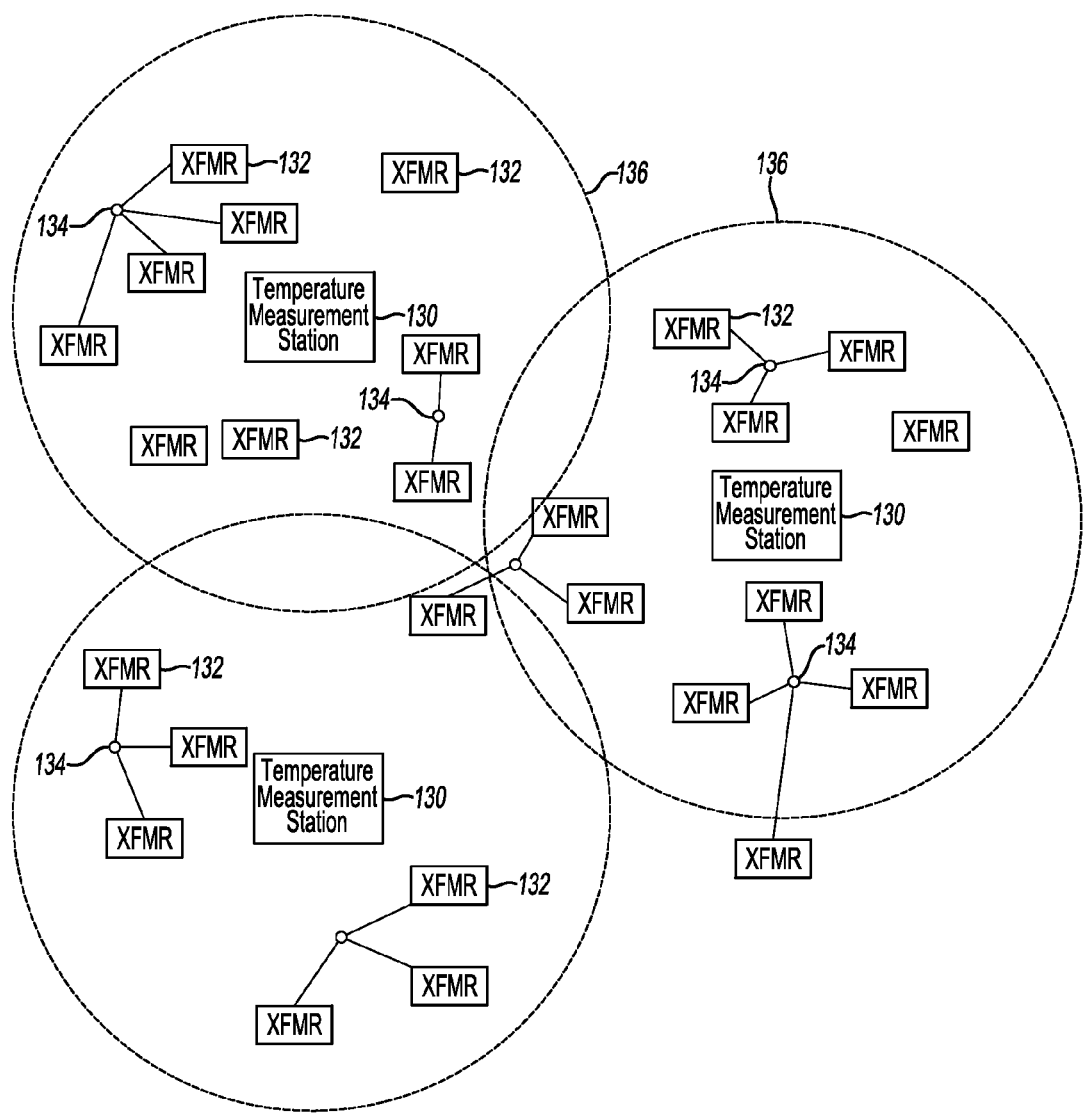
FIG. 3 schematically illustrates selected features of an example approach for estimating ambient temperatures at transformer sites.

FIG. 3 schematically represents a potential geographic distribution of transformer sites 132 and the measurement stations 130. As can be appreciated from the illustration, the number of sites 132 exceeds the number of measurement stations 130. The sites 132 are clustered together in clusters of sites that are expected to have the same or very similar ambient temperature conditions. Each of the clusters has a centroid schematically shown at 134. The stations 130 have respective areas or cells 136 that correspond to a geographic region in which the measured temperature information from that station is considered useful for estimating an ambient temperature.

The illustrated system 10 allows for estimating the ambient temperature at any or all of the sites 132 on a selected schedule. Some examples include multiple temperature estimates every hour, such as at intervals of fifteen minutes.

FIG. 4 includes a flow chart diagram 140 that summarizes an example approach for estimating ambient temperatures at any or all of the sites 132. Measurement information is obtained from the stations 130 at 142. The information obtained at 142 may be stored in the data storage 26. The station information includes at least an ambient temperature measurement at each of a series of times at the stations 130. Other useful information may also be obtained at 142, such as relative humidity and wind. The information from the stations 130 may be used for training the system 10, estimating ambient temperatures, or both.

At 144 the geographic cells or areas 136 are established. In one example, a known technique is used for determining how to set the boundaries or ranges of the cells 136. One example includes using a Voronoi diagram approach for establishing the cells 136. Station cell definition or description information is stored in the data storage 26. In some examples the processor 24 is configured to make station cell boundary determinations while in others another processor makes the boundary determinations.

At 146, information is gathered regarding the sites 132 where temperature estimates may be desired or useful. The gathered information in this example includes geographic location information (e.g., longitude and latitude), elevation information (e.g., vertical position relative to sea level), sun exposure (e.g., primarily southern exposure or northern exposure), wind pattern information, and proximity to any local heat reservoirs (e.g., bodies of water). The information regarding the sites 132 corresponds to one or more parameters that influence the ambient temperature conditions of a site compared to the conditions at another site.

The information gathered at 146 is useful for clustering the sites at 148. Each cluster in FIG. 1 includes at least one site 132. Clustering in this example associates sites with each other based on one or more parameters (e.g., the information gathered at 146) that affect the ambient temperature at the sites 132 so that the sites 132 in each cluster are likely to have approximately the same ambient temperature. Information associating each of the sites 132 with a cluster is stored in the data storage 26.

In some example embodiments the parameters are weighted so that at least one considered parameter has more significance than at least one other for purposes of clustering similar sites together. For example, elevation may have more of an influence on temperature differences than geographic proximity in some regions and elevation may be weighted to have more significance for such a region. Consider three sites with two of them being on the side of separate mountains, respectively, and a third between them in a valley between the mountains. The two mountainside sites are further apart from each other than either is from the site in the valley yet the ambient temperatures at the mountainside sites may be closer to each other than either will be to the ambient temperature at the valley site. In such a situation, the mountainside sites may be in one cluster and the valley site may be in another cluster even though the valley site is closer (in terms of longitude and latitude) to each of the mountainside sites than the latter are to each other. In other words, in the example scenario, elevation differences are weighted more significantly (i.e., considered more influential or important) than the geographic distance between sites. Other situations may benefit from a different weighting of such parameters.

A centroid for each cluster is determined at 150. In some examples, the centroid is an approximation of a positional average of at least a majority of sites 132 within the cluster. The positional average in some embodiments may be considered a center of balance of the cluster sites or a geographic center of gravity of the cluster sites. Some centroid locations are based on the parameter or parameters that are most likely to impact the similarity of ambient temperature at the sites of that cluster. For example, a centroid location at an elevation that corresponds to an average elevation of the sites in the cluster may be preferred over a centroid location that is based on respective distances from the sites if the latter is at an elevation that may experience noticeably different temperature conditions than the average elevation of the sites in that cluster. In some embodiments, the centroid may be one of the cluster sites that is determined to be representative of other cluster sites. Other embodiments include another technique for locating the centroids of the clusters, respectively, and different techniques may be used to locate different centroids within the same system.

At 152 a determination is made regarding which cell 136 to associate with each centroid 134. This information is stored in the data storage 26. Temperature estimation methodology from the station 130 corresponding to the cell 136 that includes the location of the centroid is considered the best for estimating the temperature at that centroid 134. The temperature estimate for a cluster centroid 134 is used in this example as an estimate of the temperature at all of the sites clustered together in the associated cluster.

An example embodiment includes associating a centroid with a cell based on similarity of characteristics that would likely yield a similar (or similarly varying) temperature estimate. Such characteristics include relative proximity, elevation, heat reservoir proximity, and other meteorologically impacting characteristics. This association can be accomplished by any of a variety of clustering schemes based on these characteristics.

Some embodiments include the assumption that the temperature estimation methodology that yields the best temperature estimate at the station in training would also produce the best estimate of cluster centroids with similar characteristics.

In some embodiments it may be more computationally efficient to perform the steps at 148-152 by clustering sites to measurement stations, then to further cluster each station's sites into local clusters and then to determine the centroids of the local clusters.

The process of FIG. 4 includes a training phase that begins at 154 where a history of temperature measurement information for the stations 130 is obtained from the data storage 26 or another database. Some examples include a season's worth of data and others include up to a year's worth of actual temperature measurement data for the estimations at 156. At 156 at least one parameter is determined for each of a plurality of preselected temperature estimation algorithms. This includes a lapse rate if the temperature estimation algorithm employs it. The actual measurement data for a station 130 selected for training is left out of the estimation process at 156. Parameters for the interpolation techniques of the temperature estimation algorithms are estimated from the measurements at other stations 130 at a plurality of times, such as multiple times during a diurnal period to capture variations over the course of a day. Each of those algorithms is used at 156 to estimate a temperature at the station 130 that was selected for training based on the historical data of nearby stations to identify the algorithm that provides results that are closest to the actual temperature at that station. The parameters at each of the plurality of times are optimized to give the closet estimate to the actual temperature measured at the station. The training process described above may be repeated for training any or all of the remaining stations 130.

At 158 the error is determined for each of the temperature estimation methods. At 160 the most accurate estimation algorithm (in terms of the determined error) is assigned to or associated with each station 130 and that algorithm will be used for later temperature estimations at cluster centroids 134 within the cell 136 of that station 130.

Known spatial interpolation techniques may be used in some embodiments as part of the preselected algorithms used for temperature estimations during the training phase. There are known interpolation techniques that are useful for estimating the value of a continuous field at any point using a discrete number of nearby observations of the field. One limitation, however, is that there is no known way of consistently or reliably determining how the various factors that affect estimation error performance introduce an error into an estimation. Embodiments of the approach shown in FIG. 4, therefore, include applying multiple temperature estimation techniques for estimating the temperature at each of the stations 130 and determining which of those techniques provides the best results for a particular station. In some embodiments every station may have a different assigned estimation algorithm than the other stations while in other embodiments many of the stations may have the same assigned algorithm.

According to one embodiment, the temperature estimate for each of a plurality of periods is compared to the actual temperature measurement for each period at a station. The estimation algorithm that provides the lowest average error (e.g., square of the difference between actual temperature and estimated temperature, or an $L_2$ error) over all time periods is assigned to future temperature estimates for that station. One example includes determining a lower bound that may be proven as the closest that any of the estimation algorithms could achieve. That lower bound is then compared to the estimated results to determine the lowest average difference for selecting the associated estimation algorithm for that station.

The general form of the estimation techniques used in one embodiment can be expressed as $$\theta^*(r,t) = \Sigma_{n \in N(r,t)} w_n(r,t)[\theta_n(t) - \beta(r,t)z_n] + \beta(r,t)z(r).$$

wherein r is a location of interest (e.g., a station 130), which may be specified by longitude and latitude or other two-dimensional geo-coordinates;

N(r,t) is the set of measurement stations within and around the region in which r is located at which the temperature measurements are used to estimate the temperature at location r at time t, which allows for some weather stations not being involved in an estimate or not providing measurements at the same time as other weather stations or for the case in which some measurements might be missing;

z(r) is the elevation (e.g., above mean sea level) of the location r (i.e., $z(r_n)$ is the elevation at the $n^{th}$ location r);

$\theta_n(t)$ is the ambient temperature measured at time t at the $n^{th}$ station boated at $r_n$;

$\theta^*(r,t)$ is the estimate of the ambient temperature at location r at time t;

$\beta(r,t)$ is the lapse rate of decrease of temperature with elevation at location r at time t; and $w_n(r,t)$ is the weight assigned to the temperature measured at the $n^{th}$ station at time t for estimating temperature at location r.

In this example, the lapse rate $\beta(r,t)$ is a parameter introduced to capture the rate of decrease of temperature with elevation. The lapse rate has time dependence because it may change over the course of a day. The lapse rate also has location dependence because it may vary by location. One embodiment includes obtaining the lapse rate and other modeling parameter values by minimizing cross-validation error. Some embodiments do not include lapse rate information but it is believed that elevation-related lapse rate information increases accuracy.

With the stations' estimation algorithms assigned at 160, the system 20 is configured to provide temperature estimates at any site 132 of interest. Given sufficient information regarding a site 132 of interest, the processor 24 identifies the centroid 134 of the cluster that includes the site 132 of interest. That information allows the processor 24 to identify the cell 136 that includes the location of the appropriate centroid 134. The temperature measurements from all stations 130 at a time of interest are obtained at 162. In some embodiments all station ambient temperature measurements at a given time are used, although measurements from stations closer to the site may be included with a greater weight than those from further away.

At 164 all parameters for the assigned estimation algorithm for each station 130, including the lapse rate if used, are retrieved for each of the stations 130 involved in the estimation of interest and a lapse rate surface is estimated over the entire region of interest at 166. The processor 124 provides the temperature estimate for the site 132 of interest at 168.

The temperature estimate may then be used for a desired purpose, such as providing temperature information to estimate electrical grid transformer aging or utility customer loading. Those skilled in the art that have the benefit of this description will realize how a temperature estimate obtained in a manner consistent with the techniques of this disclosure may be useful information for other situations.

The example of FIG. 4 includes a recalibration feature. At 170, the processor uses a programmed strategy to determine whether system recalibration is desired or needed. For example, the models may be recalibrated seasonally to update parameters best suited to each season. If the processor 22 should initiate recalibration, the steps from 154 to 160 are repeated to determine whether any updates or changes to the techniques used for estimating the temperature at any of the centroids 134 should be made. If recalibration is not needed, the process returns to the step schematically represented at 162 where the next temperature estimate of interest may begin at an appropriate time.

The above-described approach to estimating temperatures allows for using actual temperature measurement information from stations 130 to provide estimates for a larger number of sites 132. The disclosed techniques provide spatial and temporal specificity in a reliable and robust manner. The type of temperature estimates that may be achievable from the disclosed techniques allow for estimating temperatures at a relatively large number of diverse transformer locations with confidence that the estimate provides reasonably accurate temperature information when it is impractical to obtain actual temperature measurements at each of the sites of interest.

The approach summarized in FIG. 4 is described above as being performed by the processor 24 but that is not necessary in all embodiments. In some cases the processor 24 is dedicated to the transformer evaluation determinations and the temperature estimates are provided by separate computing resources. In other examples, like that described above, the computing resources that are considered the processor 24 include those resources that determine the estimated ambient temperatures at the transformer sites.

FIG. 5 shows an example result of a transformer evaluation over a 24 hour period. The estimated ambient temperature is shown at 200, the determined transformer hot spot temperature is shown at 202, the load is shown at 204, and the accumulated loss of life is shown at 206. The aging rate is shown at 208. The estimated ambient temperature 200 and the hot spot temperature 202 are measured against the left axis while the load 204 and the accumulated loss of life 206 are normalized and measured against the right axis in the illustration. In this example, the transformer's target hottest spot temperature is 110° C. as shown at 210.

The evaluation results shown in FIG. 5 reveal that the example transformer experienced a hottest spot temperature above the target temperature for more than ten hours. The hottest spot temperature was above 140° C. for approximately thirty minutes, which is noteworthy because oil in an oil-immersed transformer can break down above that temperature in a manner that includes forming gas bubbles that introduce other potential problems. This is one example of how the disclosed evaluation technique provides significant improvements in the ability to monitor transformers compared to approaches, such as a straight time-based approach comparing in-service time to rated lifetime or an averaging approach based on average power consumption over a billing period and average daily ambient temperatures from general meteorological databases.

FIG. 5 also shows that the average load over the illustrated period is approximately 25.8 kVA, which is barely above the rated load, but the bulk of transformer (insulation) aging occurs when the load is significantly above the rated load between the thirteenth and nineteenth hours. That indicates that the transformer experienced approximately 2.8 times the aging it normally would have under a rated load for the same time period duration shown in the illustration. In the illustration the load is normalized to 1 and referenced to the right axis.

Using an aging calculation based on average load and average ambient temperature for the same period indicates that the aging was 1.9 times the aging at rated load for twenty-four hours, which understates the aging experienced by the transformer by 50%. The techniques of the disclosed embodiments of the present disclosure provide a much more accurate picture of the aging actually experienced by the transformer during the illustrated period. The results summarized in FIG. 5 demonstrate how an embodiment of this invention provides significant improvements in the awareness of characteristics of a transformer, such as aging. The ability to use high frequency ambient temperature and loading data enhances the ability to discern the condition of a transformer.

The preceding description is illustrative rather than limiting in nature. Variations and modifications to the disclosed examples may become apparent to those skilled in the art that do not necessarily depart from the essence of the contribution to the art provided by the disclosed embodiments. The scope of legal protection can only be determined by studying the following claims.

I claim:

1. A method of evaluating a condition of a plurality of transformers that are located remotely from each other, the method comprising the steps of:
   obtaining an ambient temperature for respective sites of the transformers at a plurality of times during a period;
   determining the ambient temperatures based on an estimated ambient temperature for the respective sites of the transformers including estimating the ambient temperature by
      clustering the sites into a plurality of clusters,
      determining a centroid for each cluster,
      associating each centroid with a measurement station, and
      estimating the ambient temperature at each of the sites based on a temperature at the measurement station associated with the centroid of the cluster including the transformer site;
   determining respective loading at the transformers at the plurality of times; and
   determining respective aging rates of the transformers during the period based on the respective ambient temperatures and loadings.

2. The method of claim 1, wherein determining the respective aging rates comprises determining respective hottest spot temperatures of the transformers at the plurality of times.

3. A method of evaluating a condition of a plurality of transformers that are located remotely from each other, said method further comprising the steps of:
   performing said method of claim 1 for a plurality of periods; and
   determining respective cumulative aging of the transformers over a time including the plurality of periods.

4. The method of claim 1, wherein the plurality of times are spaced at intervals of an hour or less.

5. The method of claim 4, wherein the plurality of times are spaced at intervals of approximately five minutes.

6. The method of claim 1, wherein
   the transformers are associated with respective meters;
   the meters provide respective indications of loading based on power consumption at respective customer locations;
   the loading at each transformer comprises a total loading at each of the plurality of times; and
   the total loading is based on the indications of loading of the associated respective meters.

7. The method of claim 1, wherein there are more transformers than measurement stations.

8. A transformer evaluation device, comprising:
   a data storage; and
   a processor configured to
      obtain an ambient temperature for respective sites of the transformers at a plurality of times during a period;
      determine respective loading at the transformers at the plurality of times; and
      determine respective aging rates of the transformers during the period based on the respective ambient temperatures and loadings;
      wherein the processor is configured to determine the ambient temperature based on an estimated ambient temperature for the respective sites of the transformers; and wherein the processor is configured to estimate the ambient temperatures by
         clustering the sites into a plurality of clusters;
         determining a centroid for each cluster;
         associating each centoid with a measurement station; and
         estimating the ambient temperature at each of the sites based on a temperature at the measurement station associated with the centroid of the cluster including the transformer site.

9. The transformer evaluation device of claim 8, wherein the processor is configured to determine the respective aging rates including determining respective hottest spot temperatures of the transformers at the plurality of times.

10. The transformer evaluation device of claim 8, wherein the processor is configured to
   determining respective cumulative aging of the transformers over a time including a plurality of periods.

11. The transformer evaluation device of claim 8, wherein the plurality of times are spaced at intervals of an hour or less.

12. The transformer evaluation device of claim 11, wherein the plurality of times are spaced at intervals of approximately five minutes.

13. The transformer evaluation device of claim 8, wherein
the transformers are associated with respective meters;
the meters provide respective indications of loading based on power consumption at respective customer locations;
the loading at each transformer comprises a total loading at each of the plurality of times; and
the total loading is based on the indications of loading of the associated respective meters.

14. The transformer evaluation device of claim 8, wherein there are more transformers than measurement stations.

* * * * *